United States Patent
Vuorio et al.

(10) Patent No.: US 11,815,535 B2
(45) Date of Patent: Nov. 14, 2023

(54) METHOD FOR DETECTING LOSS OR UNDERVOLTAGE CONDITION OF PHASE OF ELECTRIC CONVERTER UNIT, CONVEYOR CONTROL UNIT, AND CONVEYOR SYSTEM

(71) Applicant: KONE Corporation, Helsinki (FI)

(72) Inventors: Teppo Vuorio, Helsinki (FI); Juhamatti Nikander, Helsinki (FI)

(73) Assignee: KONE CORPORATION, Helsinki (FI)

( * ) Notice: Subject to any disclaimer, the term of this patent is extended or adjusted under 35 U.S.C. 154(b) by 5 days.

(21) Appl. No.: 17/469,547

(22) Filed: Sep. 8, 2021

(65) Prior Publication Data

US 2022/0128606 A1 Apr. 28, 2022

(30) Foreign Application Priority Data

Oct. 28, 2020 (EP) .................................... 20204336

(51) Int. Cl.
| | | |
|---|---|---|
| *G01R 11/63* | (2006.01) | |
| *G01R 19/165* | (2006.01) | |
| *B66B 5/00* | (2006.01) | |
| *B66B 25/00* | (2006.01) | |
| *G01R 19/04* | (2006.01) | |

(52) U.S. Cl.
CPC ...... *G01R 19/16547* (2013.01); *B66B 5/0018* (2013.01); *B66B 25/006* (2013.01); *G01R 19/04* (2013.01)

(58) Field of Classification Search
CPC .. G01R 19/04; G01R 19/16547; G01R 31/52; G01R 31/3274; G01R 31/3275; B66B 5/0018; B66B 5/0031; B66B 1/30; B66B 25/006
See application file for complete search history.

(56) References Cited

U.S. PATENT DOCUMENTS

| | | | |
|---|---|---|---|
| 5,099,977 | A | 3/1992 | Hirose et al. |
| 5,754,033 | A * | 5/1998 | Thomson ................... H02J 3/38 702/182 |
| 2015/0226849 | A1* | 8/2015 | Matsuda ............... G01S 13/581 702/3 |
| 2016/0134148 | A1* | 5/2016 | Ide ......................... H02J 7/0024 307/52 |
| 2017/0242075 | A1* | 8/2017 | Hartzsch ................ H02P 29/024 |
| 2019/0219621 | A1* | 7/2019 | Morimoto .............. G01R 31/52 |
| 2021/0057997 | A1* | 2/2021 | Zhang ...................... H02M 1/08 |
| 2021/0135592 | A1* | 5/2021 | Tsuboka ................ H02M 3/155 |

FOREIGN PATENT DOCUMENTS

| | | |
|---|---|---|
| CN | 110171765 A | 8/2019 |
| EP | 0 426 056 A2 | 5/1991 |
| EP | 0 426 056 A3 | 5/1991 |

* cited by examiner

*Primary Examiner* — Thang X Le

(74) *Attorney, Agent, or Firm* — Birch, Stewart, Kolasch & Birch, LLP

(57) ABSTRACT

A method for detecting a loss or an undervoltage condition of phase of an electric converter unit, wherein the method comprises: determining an extremum value, such as a maximum and/or a minimum value, of a phase voltage of the electric converter unit for at least one fundamental period of the phase voltage, and comparing the extremum value to a first threshold value, and if, based on the comparison, a first threshold criterion related to the first threshold value is satisfied, then determining the loss or the undervoltage condition of phase.

20 Claims, 5 Drawing Sheets

METHOD FOR DETECTING LOSS OR UNDERVOLTAGE CONDITION OF PHASE OF ELECTRIC CONVERTER UNIT, CONVEYOR CONTROL UNIT, AND CONVEYOR SYSTEM

FIELD OF THE INVENTION

The present invention relates in general to conveyor systems, such as elevators, escalators, and moving walkways. In particular, however, not exclusively, the present invention concerns detection of an abnormal operating condition, such as a loss or an undervoltage condition of phase, of an electric converter unit utilized in a conveyor system for operating the conveyor, such as an elevator car, steps, or moving track, thereof.

BACKGROUND

It is desirable that the electric converters, such as included in the electric drives, for operating electric motors can survive abnormal operating conditions like loss of phase so that they will not become dangerous or cause a fire hazard. Electric converters which do not have functionality for detecting such conditions, are ought to be designed so that they will not become too hot, or even damaged. even if operating in such abnormal conditions.

There are, however, known attempts for detecting, for example, loss of phase condition in electric drives. Thus, if the converter unit thereof would detect the loss of phase situation by itself and give a fault code to prevent the running of the motor, the abnormal operating condition can be dealt safely. Running the motor without one phase can lead to unstable operation of the converter, increased stresses of the components thereof, and quality problems, for instance. Many known solutions, however, tend to be unable to detect the loss of phase reliably in different operating conditions.

SUMMARY

An objective of the present invention is to provide a method for detecting a loss or an undervoltage condition of phase of an electric converter unit, a conveyor control unit, and a conveyor system. Another objective of the present invention is that the method, the conveyor control unit, and the conveyor system enable detecting the loss or the undervoltage condition reliably and in a robust manner in various operating conditions.

The objectives of the invention are reached by a method for detecting a loss or an undervoltage condition of phase of an electric converter unit, a conveyor control unit, and a conveyor system as defined by the respective independent claims.

According to a first aspect, a method for detecting a loss or an undervoltage condition of phase of an electric converter unit is provided. The method comprises determining an extremum value, such as a maximum and/or a minimum value, of a phase voltage of the electric converter unit for at least one fundamental period of the phase voltage. The method also comprises comparing the extremum value to a first threshold value, and if, based on the comparison, a first threshold criterion related to the first threshold value is satisfied, then determining the loss or the undervoltage condition of phase.

The fundamental period refers herein to the length of one cycle of the alternating voltage and/or current. For example, in case of an electrical grid characterized by a frequency of 50 Hz or 60 Hz, the fundamental period is 20 milliseconds or about 16.7 milliseconds, respectively.

In various embodiments, the determination of the extremum value may comprise removing an average value or a DC (direct current) component of the phase voltage during the at least one fundamental period from the extremum value.

Alternatively or in addition, the determination of the extremum value may comprise determining the maximum value and the minimum value of the phase voltage for the at least one fundamental period of the phase voltage, and calculating the average value based on the maximum value and the minimum value.

Furthermore, the first threshold value may be less than a nominal amplitude of the phase voltage, such as less than 50 percent of the nominal amplitude of the phase voltage.

In various embodiments, the satisfying of the first criterion may include satisfying the criterion during at least two, such as at least five or ten, consecutive fundamental periods.

Furthermore, the method may comprise performing the method steps also for one or several other phase voltages.

Still further, the method may comprise determining if the electric converter unit has a current path to a main power supply.

In various embodiments, the method may, alternatively or in addition, comprise determining absolute values of phase currents of the electric converter unit during at least one fundamental period, integrating the absolute values of phase currents with respect to time or determining ampere-second balances of the phase currents, and comparing the integrated absolute values or the ampere-second balances to a second threshold value. Furthermore, if, based on the comparison, a second threshold criterion related to the second threshold value is satisfied, then the method may comprise comparing the integrated absolute value or the ampere-second balance of one of the phase currents to the integrated absolute value or the ampere-second balance of one or several other phase currents. Further still, if, based on the comparison, a third threshold criterion is satisfied, the loss of the phase may be determined.

Furthermore, the method may further comprise performing the comparison of the integrated absolute value or the ampere-second balance also for said one or several other phase currents.

In various embodiments, the satisfying of the second threshold criterion may relate to or occur if any one of the integrated absolute values or the ampere-second balances is higher than or equal to the second threshold value.

In various embodiments, alternatively or in addition, the satisfying of the third threshold criterion may relate to or occur if the integrated absolute value or the ampere-second balance of one of the phase currents is less than the integrated absolute value or the ampere-second balance of one other phase current.

Furthermore, in some embodiments, the satisfying of the third threshold criterion may relate to the integrated absolute value or the ampere-second balance of one of the phase currents being less than 50 or 25 percent of the integrated absolute value or the ampere-second balance of the one other phase current.

In various embodiments, the satisfying of the second threshold criterion and/or the third threshold criterion may include satisfying the criterion during at least two, such as at least five or ten, consecutive fundamental periods.

Furthermore, the extremum value and/or the absolute values of phase currents may be determined by a voltage or current measurement device or devices, respectively, arranged to an input phase or phases of the electric converter unit.

Still further, the extremum value and/or the absolute values of phase currents may be determined with a sampling rate of one sample in a millisecond.

According to a second aspect, a conveyor control unit is provided. The conveyor control unit comprising a processing unit and a memory. The conveyor control unit is configured to perform a method in accordance with the first aspect.

According to a third aspect, a conveyor system is provided. The conveyor system, such as an elevator system, an escalator, or a moving walkway, comprises a conveyor, such as an elevator car, moving steps or track. The conveyor system further comprises a conveyor control unit in accordance with the second aspect.

The present invention provides a method for detecting a loss or an undervoltage condition of phase of an electric converter unit, a conveyor control unit, and a conveyor system. The present invention provides advantages over known solutions in that it enables detecting the loss of phase and/or the undervoltage condition of the phase of the electric converter unit reliably and in robust manner in different operating conditions, thus making the electric converter unit safer to operate. Some embodiments, in which there are voltage and current related steps being run simultaneously, at least partly in parallel, or time-wisely close to each other, provide advantages in that the method makes detection of loss or undervoltage of phase more reliable and effective in different operating conditions.

Various other advantages will become clear to a skilled person based on the following detailed description.

The terms "first", "second", etc. are herein used to distinguish one element from other element, and not to specially prioritize or order them, if not otherwise explicitly stated.

The exemplary embodiments of the present invention presented herein are not to be interpreted to pose limitations to the applicability of the appended claims.

The verb "to comprise" is used herein as an open limitation that does not exclude the existence of also unrecited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Figure 1A:
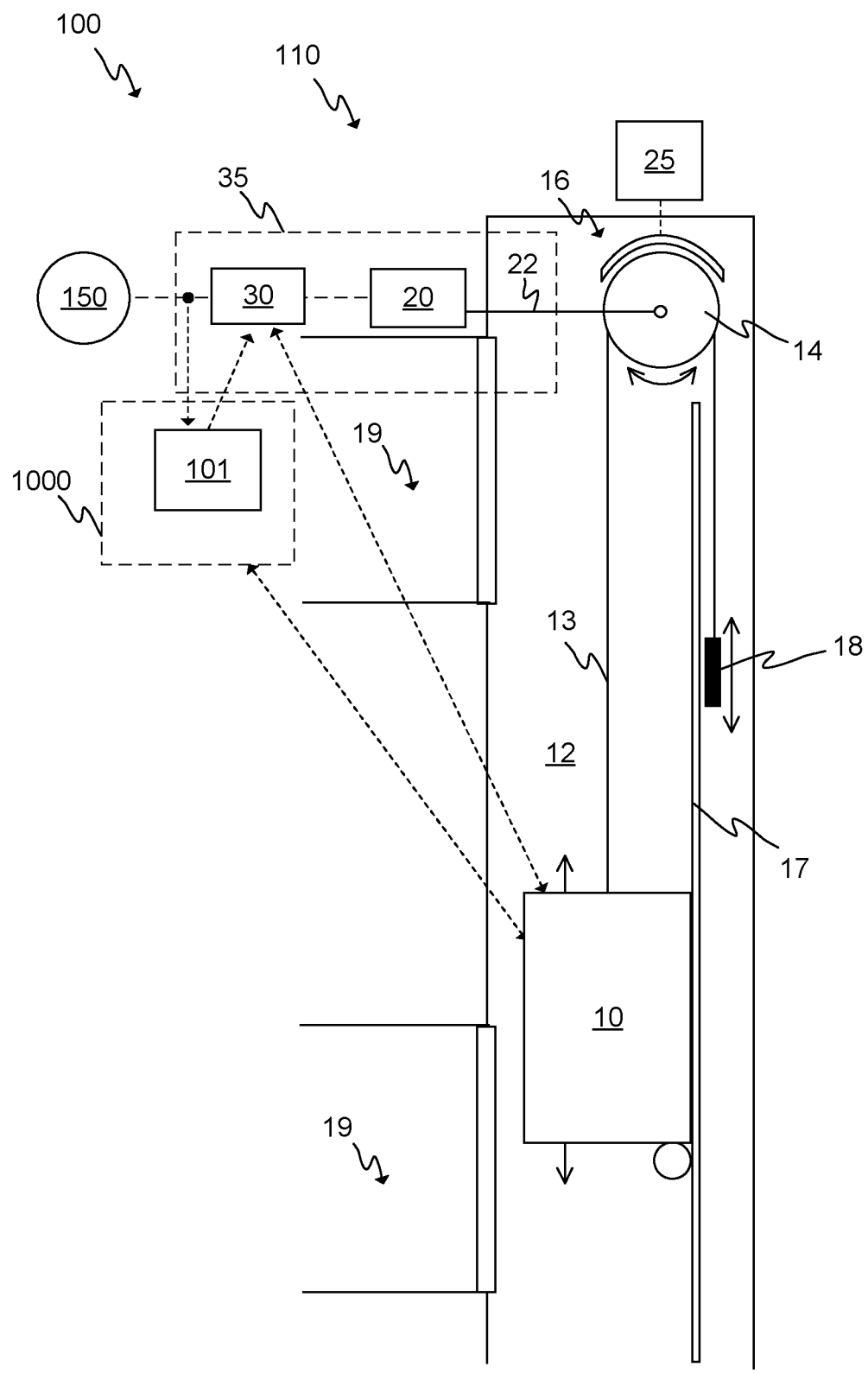
FIGS. 1A and 1B illustrate schematically conveyor systems according to some embodiments of the present invention.
Figure 1B:
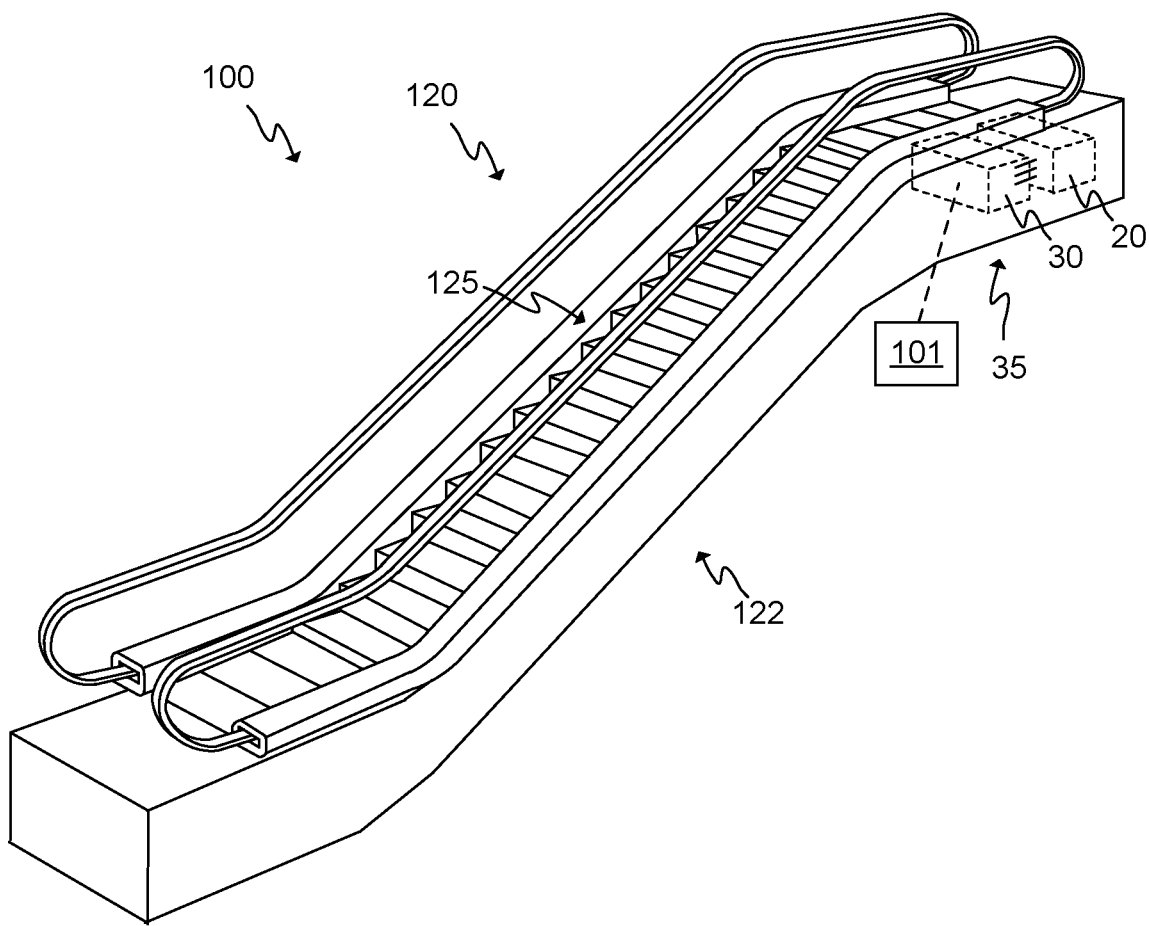

FIGS. 1A and 1B illustrate schematically conveyor systems 100 according to some embodiments of the present invention. In FIG. 1A, the conveyor system 100 is an elevator system 110. The elevator system 110 (which may comprise one, such as depicted in FIG. 1A, or several elevators, that is being an elevator group) may comprise an elevator car 10, that is the conveyor of the conveyor system 100, arranged to be moved or movable in an elevator shaft 12. The moving of the elevator car 10 may be implemented, preferably, by a hoisting rope or belt 13 in connection with a traction sheave 14 or the like. Furthermore, the elevator system 110 comprises an electric motor 20 arranged to operate, such as rotate by the rotor thereof, the traction sheave 14 for moving the elevator car 10, if not essentially directly coupled to the hoisting rope 13. The traction sheave 14 may be connected, via a mechanical connection 22, directly or indirectly via a gear to a shaft of the motor 20. The elevator system 110 may comprise a machine room or be machine roomless, such as have the motor 20 in the elevator shaft 12. In some embodiments, the elevator car 10 may be arranged to be moved by a linear motor comprising a stator beam fixed and extending in the elevator shaft 12, and at least one mover of the linear motor being coupled to the elevator car 10 for moving thereof.

The elevator system 110 may preferably comprise landings 19 or landing floors and, for example, landing floor doors and/or openings, between which the elevator car 10 is arranged to be moved during the normal elevator operation, such as to move persons and/or items between said landings 19. The landings 19 may be served by one or several elevator cars of the elevator system 110.

The elevator system 110 may preferably comprise at least one, or at least two, hoisting machinery brake(s) 16 configured for resisting or, preferably, preventing the movement of the motor 20, that is the rotor thereof, directly or via the traction sheave 14 or components thereof and/or therebetween. Furthermore, the elevator 100 may comprise a brake controller 25 configured to operate at least one of the at least one hoisting machinery brake 16. The brake controller 25 may further be in connection with other elements of the elevator 100, such as an elevator control unit 1000. The brake controller 25 may comprise an actuator (not shown) for operating the brake 16 or at least be in connection with such an actuator. In case of utilizing linear motor or motors, there may, preferably, also be brake(s) arranged to hold and/or provide deceleration of the elevator car 10.

There may additionally be, at least in some embodiments, a counterweight 18 arranged in connection with the elevator car 10 such as is known to a person skilled in the art of elevators. Still further, the elevator system 110 may additionally comprise a guide rail 17 or rails 17 arranged into the elevator shaft 12 for guiding the movement of the elevator car 10. The elevator car 10 may comprise guide shoes, rollers or the like in moving in contact with the guide rails 17.

The elevator system 110 may further comprise an electric drive unit 35, such as comprising at least a converter unit 30, for example, including a switched-mode power converter, and preferably the motor 20. The converter unit 30 may be a controllable converter unit 30, such as capable of adapting its input and/or output substantially continuously.

In various embodiments, the elevator drive unit 35, such as the converter unit 30 thereof, may comprise an input for receiving absolute position and speed information of an elevator car 10, such as from an encoder mounted to the elevator car 10 and/or to the motor 20, and a processing unit configured to calculate a motion profile of an elevator car 10. The elevator car 10 may be configured to be driven by the elevator drive unit 35 according to the motion profile. The motion profiles may differ depending on the operating condition of the elevator system 110.

Furthermore, the converter unit 30 may comprise, or substantially be, an inverter or a frequency converter, for connecting to, and controlling the operation of, the motor 20, and a controller in connection with the converter unit 30, wherein the controller is configured to operate the converter unit 30 to provide electrical power (signals), such as having variable voltage and variable frequency, to the electromagnetic components, such as to the windings, of the motor 20. The controller may be a separate controller device or be comprised in the converter unit 30, for instance. In various embodiments, the controller may represent the conveyor control unit 101. In some embodiments, the conveyor control unit 101 may be separate or comprised in an elevator control unit 1000.

Still further, the converter unit 30 may be arranged to be fed by an electrical power source 150, such as of the elevator 100, for example from an external electrical power grid or mains power supply, or another power source, for example, a battery system. Additionally, the electrical power source 150 may intake electrical power from the converter unit 30.

In various embodiments, the elevator system 110 comprises an elevator control unit 1000. The elevator control unit 1000 may be disposed in a door frame of a landing 19 or in a landing door frame. The converter unit 30 may be disposed in the elevator shaft 12 or the hoistway 12. The converter unit 30 may be arranged to supply power from mains to the electric motor 20 of the hoisting machine to drive an elevator car 10. The elevator control unit 1000 may be, for example, configured to implemented or perform at least one of the following: to receive service requests from elevator passengers, such as via an elevator call request system, and calculate a motion profile for the elevator car 10 to serve the service requests. In various embodiments, the elevator control unit 1000 may represent the conveyor control unit 101.

FIG. 1B illustrates schematically a conveyor system 100 according to an embodiment of the present invention. In FIG. 1B, the conveyor system 100 is an escalator 120. The escalator 120 may comprise at least a first, or upper, landing and a second, or lower, landing as well as an electric drive system 35 for moving the steps thereof. Furthermore, the escalator 120 preferably comprises a balustrade 122 for supporting the steps 125 and various other components, and other elements of escalators 120 which are known to a skilled person per se, such as moving handrail and components and/or devices related to thereto, and driving means, such as a chain, a drive wheel and/or sprocket, for moving the steps 125 by the drive system 35.

In accordance with still another embodiment, the conveyor system 100 may be a moving walkway. The moving walkway may be substantially similar to the escalator 120 in FIG. 1B except that there is arranged a moving track instead of the moving steps 125. The moving walkway may comprise at least two landings, a first and a second landing, as well as an electric drive system 35 for moving the track thereof. The moving walkway may be horizontal or inclined. The moving walkway may also comprise other elements of moving walkways which are known to a skilled person per se, such as moving handrail and components and devices related to thereto, and means, such as a chain, a drive wheel and/or sprocket, for moving the track by the drive system 35.

Even though in FIG. 1B, the elements of the electric drive system 35 are shown to reside at the upper landing, it should be noted that they could, alternatively or in addition, be arranged in various other positions of the system 100 as well.

Figure 2:
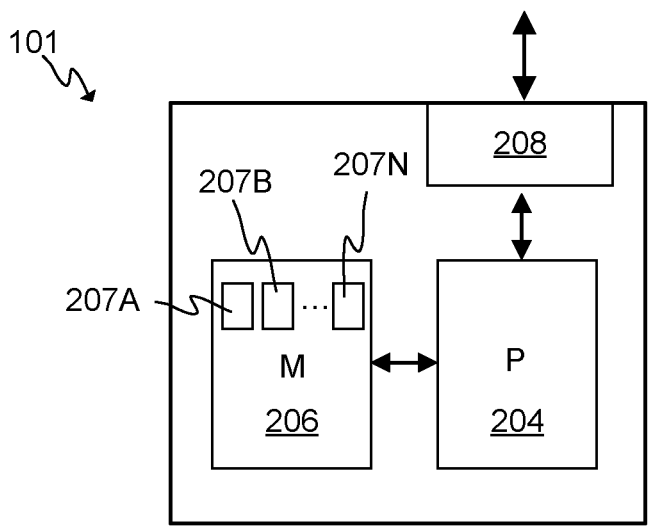
FIG. 2 illustrates schematically a conveyor control unit according to an embodiment of the present invention.

FIG. 2 illustrates schematically a conveyor control unit 101 according to an embodiment of the present invention. The conveyor control unit 101 may comprise one or more processors 204, one or more memories 206 being volatile or non-volatile, or non-transitory, for storing portions of computer program code 207A-207N and any data values, and optionally one or more user interface units. The mentioned elements may be communicatively coupled to each other with e.g. an internal bus. Furthermore, the conveyor control unit 101 may comprise a communication interface 208 for receiving and/or transmitting data and or command signals, etc. from/to outside of the conveyor control unit 101. Thus, for example, the measurements by sensors, such as voltage and/or current sensors, may be received by the communication interface 208. Further, preferably, the conveyor control unit 101 may be configured to send command signals to one or several devices of the conveyor system 100 via the communication interface 208. The communication interface 208 may be based on wireless and/or wired technology, and utilize one or several communication protocols, such as utilizing communication bus(es).

The processor 204 of the conveyor control unit 101 is at least configured to implement at least some method steps as described herein, for example, hereinbelow with respect to FIGS. 4-6. The implementation of the method may be achieved by arranging the processor 204 to execute at least some portion of computer program code 207A-207N stored in the memory 206 causing the processor 204, and thus the conveyor control unit 101, to implement one or more method steps as described. The processor 204 is thus arranged to access the memory 206 and retrieve and store any information therefrom and thereto. For sake of clarity, the processor 204 herein refers to any unit suitable for processing information and control the operation of the conveyor control unit 101, among other tasks. The operations may also be implemented with a microcontroller solution with embedded software. Similarly, the memory 206 is not limited to a certain type of memory only, but any memory type suitable for storing the described pieces of information may be applied in the context of the present invention.

Figure 3A:
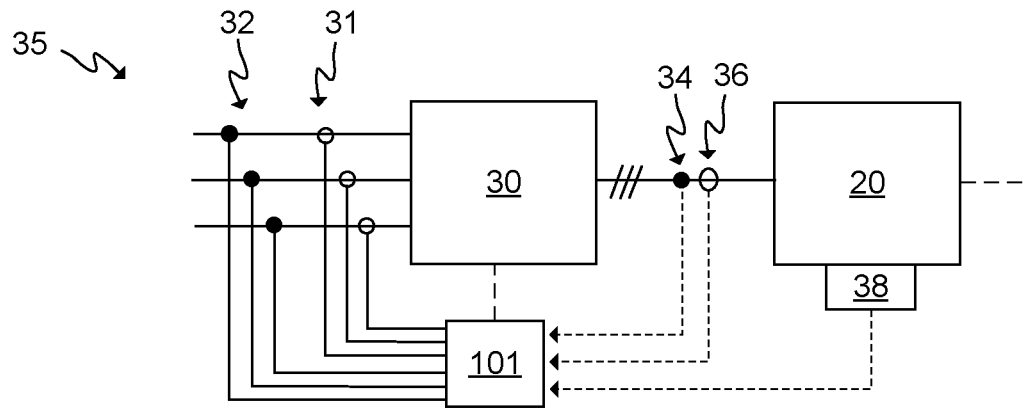
FIGS. 3A-3C illustrate schematically electric drive units or at least portions thereof according to some embodiments of the present invention.
Figure 3B:
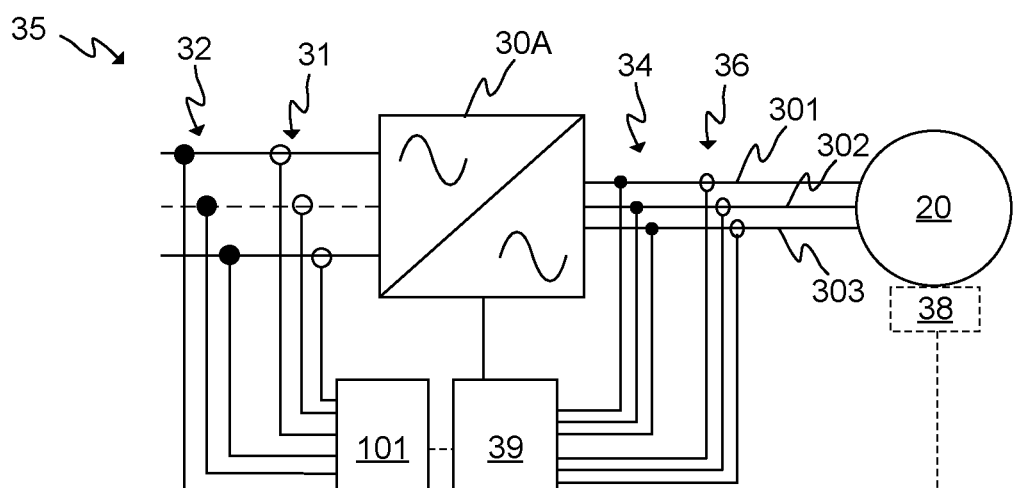
Figure 3C:
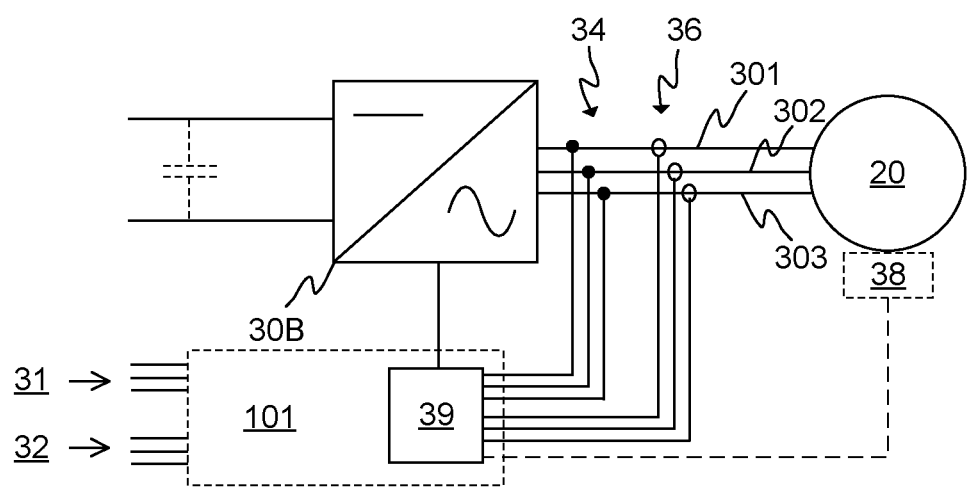

FIGS. 3A-3C illustrate schematically electric drive units 35 or at least portions thereof according to some embodiments of the present invention.

In FIG. 3A, the electric drive units 35 comprises the electric converter unit 30, such as a switched-mode power converter unit, and connected thereto the motor 20. The electric converter unit 30 may be a frequency converter which input may be connected to the electrical power source 150, such as a single-phase, a two-phase or a three-phase electrical grid, and its output to the motor 20, such as, optionally, to three phases thereof. The optional three-phase connection between the electric converter unit 30 and the motor 20 is shown in FIG. 3A with a single line having three short intersecting lines.

In various embodiments, the electric drive unit 35 may comprise a first current 31 and/or a first voltage 32 sensor(s) arranged to determine current and/or voltage), such as phase currents and voltages of the three-phase connection, at the input of the electric converter unit 30.

Furthermore, the electric drive unit 35 may, preferably, comprise speed and/or position determining means 38, such as a speed and/or position measurement device, for determining the speed, such as rotational speed and angle, or linear speed and linear position, of the motor 20. Furthermore, there may be second current 36 and/or second voltage 34 sensors arranged to determine current and/or voltage at the output of the electric converter unit 30 and/or at the input of the motor 20.

In FIGS. 3B and 3C, as well as in various other embodiments of the present invention, the motor 20 is a three-phase motor having 20 having motor phases U 301, V 302, and W 303 connected to the output of the electric converter unit 30. The motor 20 may be a permanent magnet motor, for instance.

In FIG. 3B, the electric converter unit 30 is a frequency converter 30A which may be capable of converting, for example, a voltage and/or a current having a first frequency to a voltage and/or current with a second frequency, wherein the amplitudes of the converted signals and/or the second frequency is the same or different with respect to the first frequency. The frequency converter 30A may comprise a rectifier phase capable of operating in one or more quadrants. The rectifier phase may be capable of converting the alternating current (AC) voltages and currents of the electrical power source into direct current (DC) currents and DC voltages in DC link, optionally of the intermediate circuit, of the frequency converter 30A. The frequency converter 30A may also comprise an inverter phase capable of converting the DC voltages or currents into AC voltages or currents, thus controlling the operation of the motor 20, and capable of operating in one or more quadrants. There may also be an intermediate circuit connected between the rectifier and inverter phases. The intermediate circuit may comprise an electrical storage element such as a (super)capacitor or an inductor for smoothing a DC voltage or current, and at least temporarily storing electrical energy therein.

As can be seen in FIGS. 3A-3C, the operation of the electric drive unit 35 may be controlled by the conveyor control unit 101. In various embodiments, however, there may be arranged a converter controller 39 for controlling the operation of the electric converter unit 30, which the converter controller 39 is at least communicatively connected to the conveyor control unit 101 and, thereby may be a separate device with respect to the conveyor control unit 101. Alternatively, the converter controller 39 may be substantially comprised in the conveyor control unit 101.

In the embodiment of FIG. 3C, a portion of the electric drive unit 35 is shown, which the portion may be an inverter 30B. The inverter 30B is, preferably, capable of converting the DC voltages or currents into AC voltages or currents, thus controlling the operation of the motor 20, and capable of operating in one or more quadrants. There may also be an input circuit connected to the DC link of the inverter 30B. The input circuit may comprise an electrical storage element such as a capacitor or an inductor for smoothing a DC voltage or current, and at least temporarily storing electrical energy therein. The inverter 30B may be fed electrical power from a DC source or by a rectifier or from a battery (bank).

Figure 4:
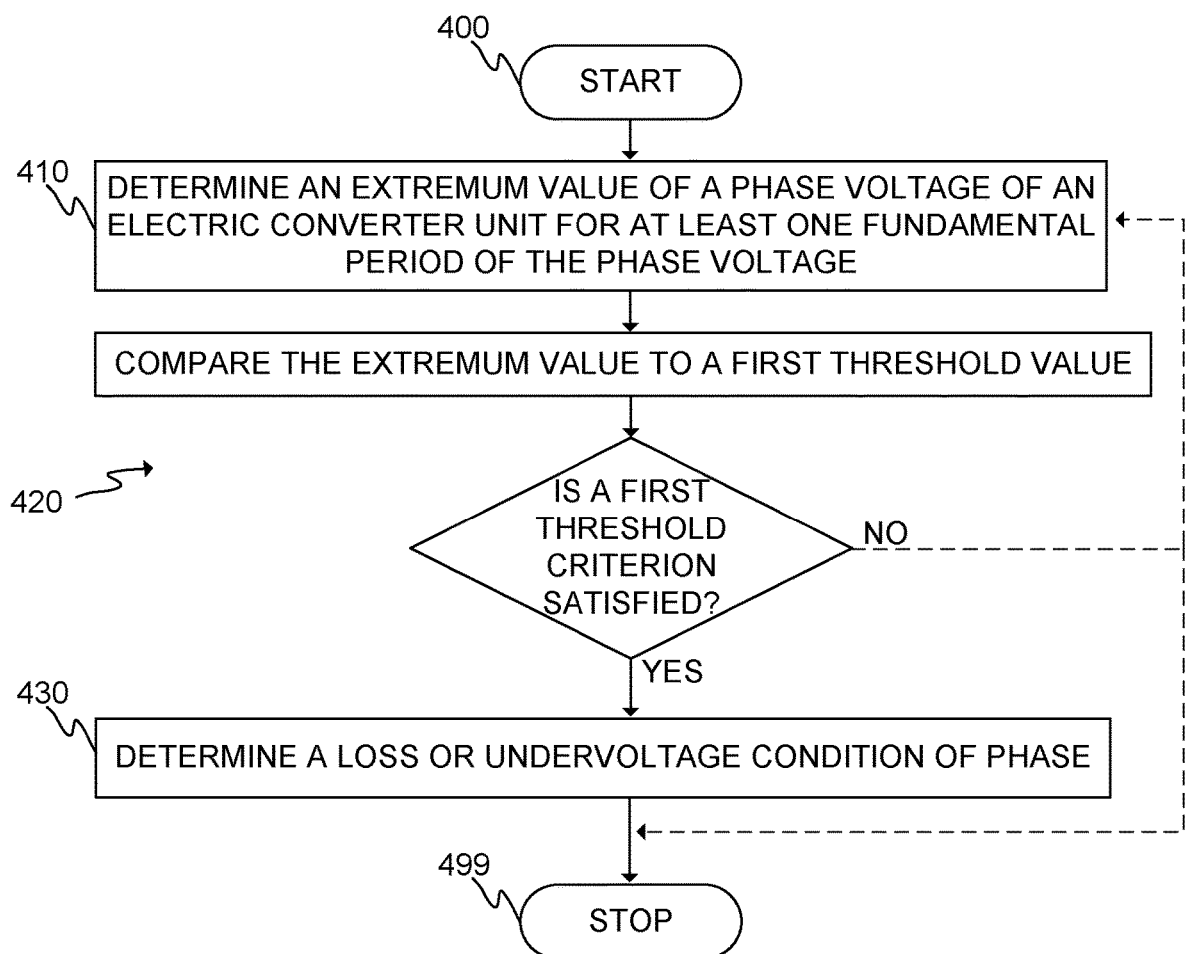
FIG. 4 shows a flow diagram of a method according to an embodiment of the present invention.

FIG. 4 shows a flow diagram of a method according to an embodiment of the present invention.

Step 400 refers to a start-up phase of the method. Suitable equipment and components, such as current and/or voltage measurement devices, and/or an electric converter unit 30 and a motor 20, are obtained and related systems assembled and configured for operation, preferably, for driving the conveyor of a conveyor system 100.

Step 410 refers to determining an extremum value, such as a maximum and/or a minimum value, of a phase voltage of the electric converter unit 30, preferably that of the input side of the electric converter unit 30, for at least one fundamental period, or for several (preferably consecutive) periods, of the phase voltage. A sampling rate of 1 millisecond may be used, for instance.

In various embodiments, the determination of the extremum value may comprise removing an average value or a DC component of the phase voltage during the at least one or several fundamental periods from the extremum value.

Furthermore, alternatively or in addition, the determination of the extremum value may comprise determining the maximum value and the minimum value of the phase voltage for the at least one or several fundamental periods of the phase voltage, and calculating the average value based on the maximum value and the minimum value. Thus, the logic may be as follows: if (U_a>Max_a) then Max_a=U_a; if (U_b>Max_b) then Max_b=U_b, if (U_c>Max_c) then Max_c=U_c; if (U_a<Min_a) then Min_a=U_a; if (U_b<Min_b) then Min_b=U_b, and if (U_c<Min_c) then Min_c=U_c; where U_a to U_c are values of the phase voltages (phases a, b, c; or first, second, and third phase), and Max_a to Max_c and Min_a to Min_c are the determined maximum and minimum values of the phase voltages during the chosen time period of one or several fundamental periods. Then the averages may be calculated by Avg_a=(Max_a+Min_a)/2, Avg_b=(Max_b+Min_b)/2, and Avg_c=(Max_c+Min_c)/2. Thereby, the average component, and/or the DC component, may be removed from the maximum values based on the following: Max_a=Max_a−Avg_a, Max_b=Max_b−Avg_b, and Max_c=Max_c−Avg_c.

Step 420 refers to comparing the determined extremum value to a first threshold value, and determining, based on the comparison, if a first threshold criterion related to the first threshold value is satisfied. In some embodiments, the first threshold value may be less than a nominal amplitude of the phase voltage, such as less than 50 percent of the nominal amplitude of the phase voltage.

If the first threshold criterion is satisfied, then step 430 may be performed. Otherwise, the method execution may be stopped or another extremum value may be determined.

Step 430 refers to determining the loss or the undervoltage condition of phase. This may, for example, further include providing a command signal to the electric converter unit 30, or the converter controller 39 thereof, for changing the operation mode thereof accordingly, such as stopping the operation.

Method execution may be stopped at step 499.

In preferable embodiments, the method steps described hereinabove related to FIG. 4, especially at least steps 410 and 420, may be performed also for one or several other, or for each one of the other phase voltages.

Furthermore, the method may, in accordance with various embodiments, comprise determining if the electric converter unit 30 has a current path to a main power supply 150. This may be performed, for example, by monitoring the status of main contactor(s) or relay(s) of the electric converter unit 30. It should be noted that there may be additional components/devices, that is in addition to the current 31 and/or voltage measurements 32, arranged between the power supply 150 and the electric converter unit 30, such as filters, being an LCL-filter, for instance, through which the current path may be established. In some embodiments, the step of determining the current path may be performed prior to the steps in connection to FIG. 5 as described hereinbelow.

Figure 5:
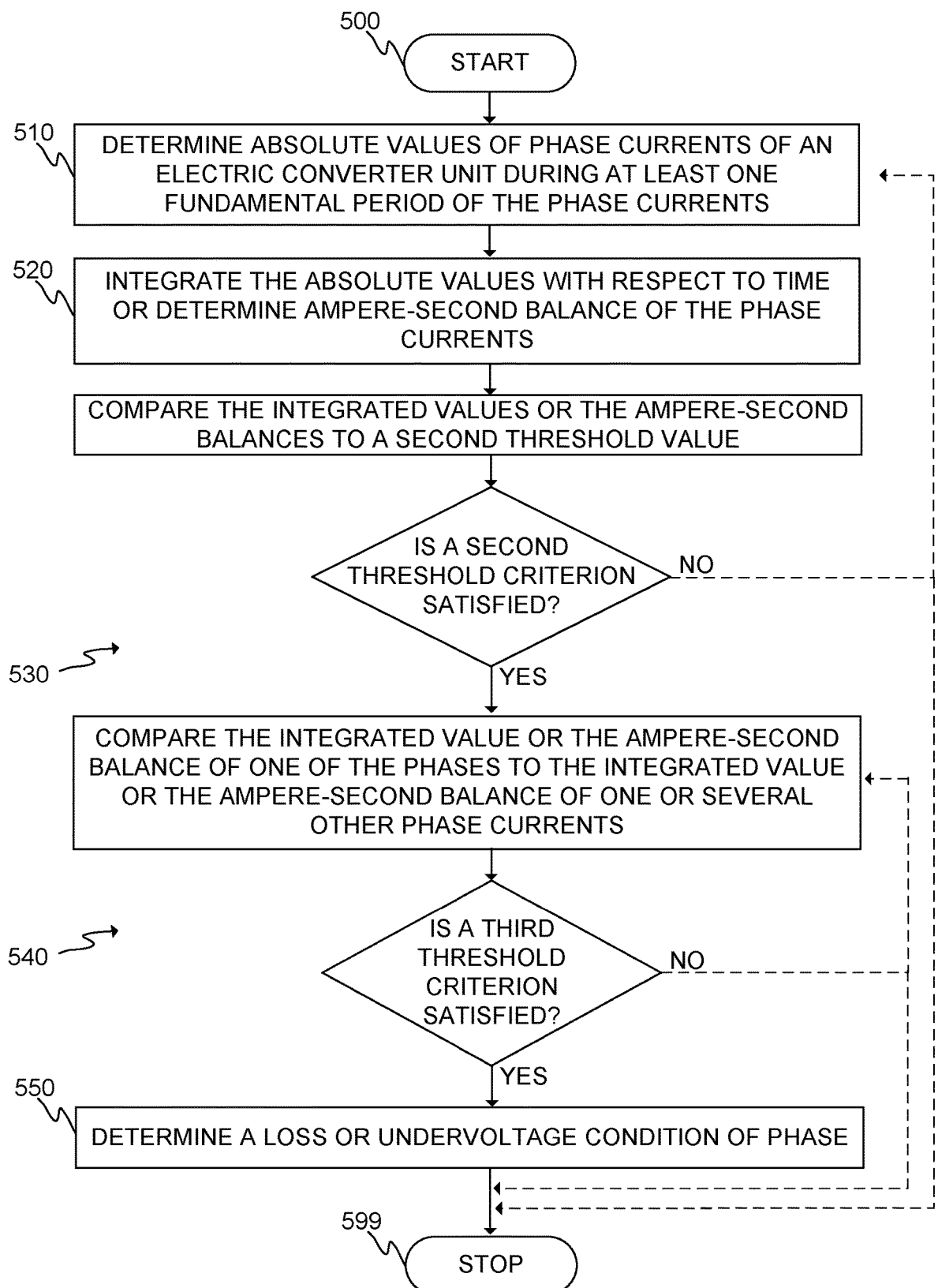
FIG. 5 shows a flow diagram of a method according to an embodiment of the present invention.

FIG. 5 shows a flow diagram of a method according to an embodiment of the present invention. The steps in FIG. 5 may, preferably, be performed substantially simultaneously or at least partly in parallel, or at least timewise closely to each other, such as right after the other, with respect to method steps of FIG. 4 or one or more steps as described hereinabove in connection to FIG. 4.

Step 500 refers to a start-up phase of the method. This may, in various embodiments, be essentially similar to step 400, or be even performed simultaneously to step 400. However, at least current measurements 31 may be arranged, preferably, to the input of the electric converter unit 30, if not done already in step 400.

Step 510 refers to determining absolute values of phase currents, preferably of input currents, of the electric converter unit 30 during at least one or several fundamental periods. A sampling rate of 1 millisecond may be used, for instance.

Step 520 refers to integrating the absolute values of phase currents with respect to time or determining ampere-second balances of the phase currents. The integration may be performed, for example, by summing the consecutive absolute values of the currents to each other. Thus, the values as a result of the integration are positive values.

Step 530 refers to comparing the integrated absolute values or the ampere-second balances to a second threshold value, and determining, based on the comparison, if a second threshold criterion related to the second threshold value is satisfied.

In various embodiments, the satisfying of the second threshold criterion may relate to any one of the integrated absolute values or the ampere-second balances being higher than or equal to the second threshold value.

Specifications for a non-limiting exemplary elevator frequency converter 30A (3-input phases without neutral) may be as follows: input nominal voltage 400 V AC, input nominal current 12.5 A @ 400 V AC, output nominal voltage 0-360 V, and max. DC link voltage 800 V DC. As is clear to a skilled person, these values may vary depending on the sizing and/or design of the frequency converter 30A, for instance. Thus, in some embodiments, relating to the first threshold value, a peak phase voltage based on the above non-limiting specifications is $\sqrt{2}/\sqrt{3}*400$ V, that is, about 326 V, in which case, a 50% of the peak value, or the nominal amplitude of the phase voltage, would be about 163 V to serve as the first threshold value.

If the second threshold criterion is satisfied, then step 540 may be performed. Otherwise, the method execution may be stopped or another set of absolute values may be determined.

Step 540 refers to comparing the integrated absolute value or the ampere-second balance of one of the phase currents to the integrated absolute value or the ampere-second balance of one or several other phase currents, and determining, based on the comparison, if a third threshold criterion is satisfied. In various embodiments, the comparison of the integrated absolute value or the ampere-second balance may also be performed for the one or several, even each one of, other phase currents. The third threshold criterion and the corresponding comparison may relate to, for example, the following: if (area_a<area_b*0.25) or (area_a<area_c*0.25), that is, if determined area_a is smaller than 0.25 of area_b or 0.25 of area_c, it may be concluded that loss of phase situation active in the corresponding phase, that is supply phase "a". Same comparison may be performed for other phases as well.

In various embodiments, the satisfying of the third threshold criterion may relate to the integrated absolute value or the ampere-second balance of one of the phase currents being less than the integrated absolute value or the ampere-second balance of one other phase current. For example, the satisfying of the third threshold criterion may relate to the integrated absolute value or the ampere-second balance of one of the phase currents being less than 50 or 25 percent of the integrated absolute value or the ampere-second balance of the one other phase current.

Step 550 refers to determining the loss of the phase or the undervoltage condition of phase.

Method execution may be stopped at step 599.

In various embodiments, the satisfying of the second threshold criterion and/or the third threshold criterion may include satisfying the criterion during at least two, such as at least five or ten, consecutive fundamental periods.

Furthermore, the extremum value and/or the absolute values of phase currents may, preferably, be determined by a voltage or current measurement device or devices, respectively, arranged to an input phase or phases of the electric converter unit 30.

By having the method steps related to FIGS. 4 and 5 being run simultaneously, at least partly in parallel, or timewise close to each other, provides advantages in that they make detection more reliable and effective in different operating conditions. For example, the method steps of FIG. 4 may be utilized to detect phase missing as soon as electric drive unit 35, or at least the electric converter unit 30 thereof, is powered or standing, and the method steps of FIG. 5 during running when current is flowing.

The invention claimed is:

1. A method for detecting a loss or an undervoltage condition of phase of an electric converter unit, wherein the method comprises:
    determining an extremum value, including a maximum and/or a minimum value of a phase voltage of the electric converter unit for at least one fundamental period of the phase voltage, and
    comparing the extremum value to a first threshold value, and if, based on the comparison, a first threshold criterion related to the first threshold value is satisfied, then
    determining the loss or the undervoltage condition of phase.

2. The method of claim 1, wherein the determination of the extremum value comprises removing an average value or a DC component of the phase voltage during the at least one fundamental period from the extremum value.

3. The method of claim 2, wherein the determination of the extremum value comprises determining the maximum value and the minimum value of the phase voltage for the at least one fundamental period of the phase voltage, and calculating the average value based on the maximum value and the minimum value.

4. The method of claim 2, wherein the first threshold value is less than 50 percent of a nominal amplitude of the phase voltage.

5. The method of claim 1, wherein the determination of the extremum value comprises determining the maximum value and the minimum value of the phase voltage for the at least one fundamental period of the phase voltage, and calculating the average value based on the maximum value and the minimum value.

6. The method of claim 5, wherein the first threshold value is less than 50 percent of a nominal amplitude of the phase voltage.

7. The method of claim 1, wherein the first threshold value is less than 50 percent of a nominal amplitude of the phase voltage.

8. The method of claim 1, wherein the satisfying the first threshold criterion includes satisfying the first threshold criterion during at least two, consecutive fundamental periods.

9. The method of claim 1, comprising performing the method steps also for one or several other phase voltages.

10. The method of claim 1, comprising determining if the electric converter unit has a current path to a main power supply.

11. The method of claim 1, wherein the extremum value and/or the absolute values of phase currents are determined by a voltage or current measurement device or devices, respectively, arranged to an input phase or phases of the electric converter unit.

12. The method of claim 1, wherein the extremum value and/or the absolute values of phase currents are determined with a sampling rate of one sample in a millisecond.

13. A conveyor control unit comprising a processing unit and a memory, wherein the conveyor control unit is configured to perform a method according to claim 1.

14. A conveyor system, such as an elevator system, an escalator, or a moving walkway, comprising a conveyor moving steps or track, wherein the conveyor system comprises the conveyor control unit of claim 13.

15. A method for detecting a loss or an undervoltage condition of phase of an electric converter unit, the method comprising:
    determining an extremum value, including a maximum and/or a minimum value, of a phase voltage of the electric converter unit for at least one fundamental period of the phase voltage,
    comparing the extremum value to a first threshold value, and if, based on the comparison, a first threshold criterion related to the first threshold value is satisfied, then determining the loss or the undervoltage condition of phase,
    determining absolute values of phase currents of the electric converter unit during at least one fundamental period,
    integrating the absolute values of phase currents with respect to time or determining ampere-second balances of the phase currents,
    comparing the integrated absolute values or the ampere-second balances to a second threshold value, and if, based on the comparison, a second threshold criterion related to the second threshold value is satisfied, then
    comparing the integrated absolute value or the ampere-second balance of one of the phase currents to the integrated absolute value or the ampere-second balance of one or several other phase currents, and, if, based on the comparison, a third threshold criterion is satisfied, then
    determining the loss of the phase.

16. The method of claim 15, comprising performing the comparison of the integrated absolute value or the ampere-second balance also for the one or several other phase currents.

17. The method of claim 15, wherein the satisfying of the second threshold criterion relates to any one of the integrated absolute values or the ampere-second balances being higher than or equal to the second threshold value.

18. The method of claim 15, wherein the satisfying of the third threshold criterion relates to the integrated absolute value or the ampere-second balance of one of the phase currents being less than the integrated absolute value or the ampere-second balance of one other phase current.

19. The method of claim 18, wherein the satisfying of the third threshold criterion relates to the integrated absolute value or the ampere-second balance of one of the phase currents being less than 50 or 25 percent of the integrated absolute value or the ampere-second balance of the one other phase current.

20. The method of claim 15, wherein the satisfying of the second threshold criterion and/or the third threshold criterion includes satisfying the criterion during at least two consecutive fundamental periods.

* * * * *